(12) United States Patent  (10) Patent No.: US 7,755,154 B2
Lee  (45) Date of Patent: Jul. 13, 2010

(54) IMAGE SENSOR

(75) Inventor: Yong-Suk Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 274 days.

(21) Appl. No.: 11/831,442

(22) Filed: Jul. 31, 2007

(65) Prior Publication Data
US 2008/0030724 A1    Feb. 7, 2008

(30) Foreign Application Priority Data
Aug. 1, 2006   (KR) .................. 10-2006-0072628

(51) Int. Cl.
H01L 27/14   (2006.01)
H01L 31/00   (2006.01)
(52) U.S. Cl. .............. 257/431; 257/294; 257/432; 438/57; 438/69
(58) Field of Classification Search ........ 257/294, 257/431, 432, 758; 438/57, 69, 73
See application file for complete search history.

(56) References Cited

U.S. PATENT DOCUMENTS 6,638,786 B2 * 10/2003 Yamamoto .................. 438/57
7,068,432 B2 *  6/2006 Boettiger et al. .......... 359/619
7,544,982 B2 *  6/2009 Yu et al. ..................... 257/294

FOREIGN PATENT DOCUMENTS

| JP | 11-340446 | 12/1999 |
| KR | 20040058756 | 7/2004 |
| KR | 1020050010615 A | 1/2005 |
| KR | 20050018512 | 2/2005 |

* cited by examiner

Primary Examiner—Phuc T Dang
(74) Attorney, Agent, or Firm—Sherr & Vaughn, PLLC

(57) ABSTRACT

An image sensor which may maximize the optical integrity by maximizing the amount of incident light through a microlens layer and a method for manufacturing an image sensor. An image sensor may include a pixel region, a microlens layer, and at least one microlens. The microlens layer may include a plurality of microlenses on the pixel region. At least one microlens has a shape different from the rest of the microlenses.

6 Claims, 1 Drawing Sheet

IMAGE SENSOR

The present application claims priority under 35 U.S.C. 119 to Korean Patent Application No. 10-2006-0072628 (filed on Aug. 1, 2006), which is hereby incorporated by reference in its entirety.

BACKGROUND

Figure 1:
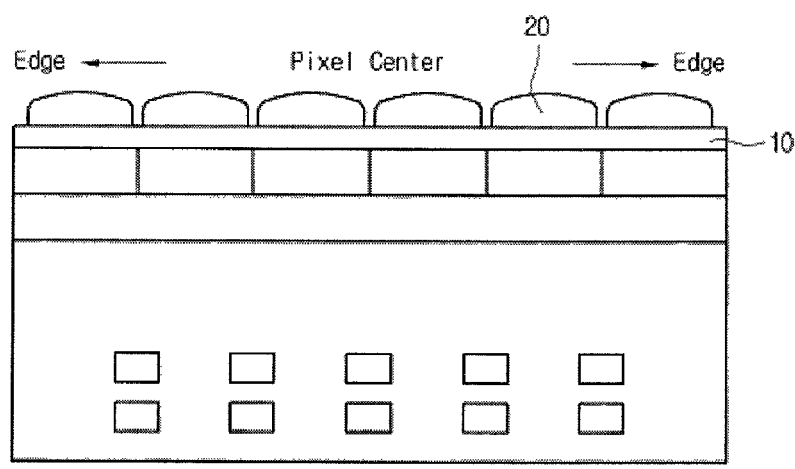

A microlens may be manufactured to improve optical integrity in a pixel array region of an image sensor. Example FIG. 1 is a cross-sectional view illustrating a microlens structure of an image sensor. Microlenses 20 may be on and/or over color filters 10. All of microlenses 20 may have substantially the same shape. Due to a predetermined shape, the incident angle of light onto an edge of a pixel may increase.

As the incident angle of light increases at the edge of a pixel, the incident angles of light incident onto the center and edge portions of the pixel may be as large as 20° to 30°. Accordingly, sensitivity may gradually deteriorate from a center portion to an edge portions of a chip, which may result in light shading that may degrade image quality.

SUMMARY

In embodiments, an image sensor may include a pixel region; and a plurality of microlenses over the pixel region, wherein at least two of the plurality of microlenses have different shapes.

In embodiments, a method of manufacturing an image sensor includes: reflowing a plurality of microlenses over a pixel region; and irradiating ultraviolet light on the plurality of microlenses over the pixel region during the reflow process to form the microlenses to have different shapes.

DRAWINGS

Example FIG. 1 is a cross-sectional view illustrating a microlens structure of an image sensor.

Figure 2:
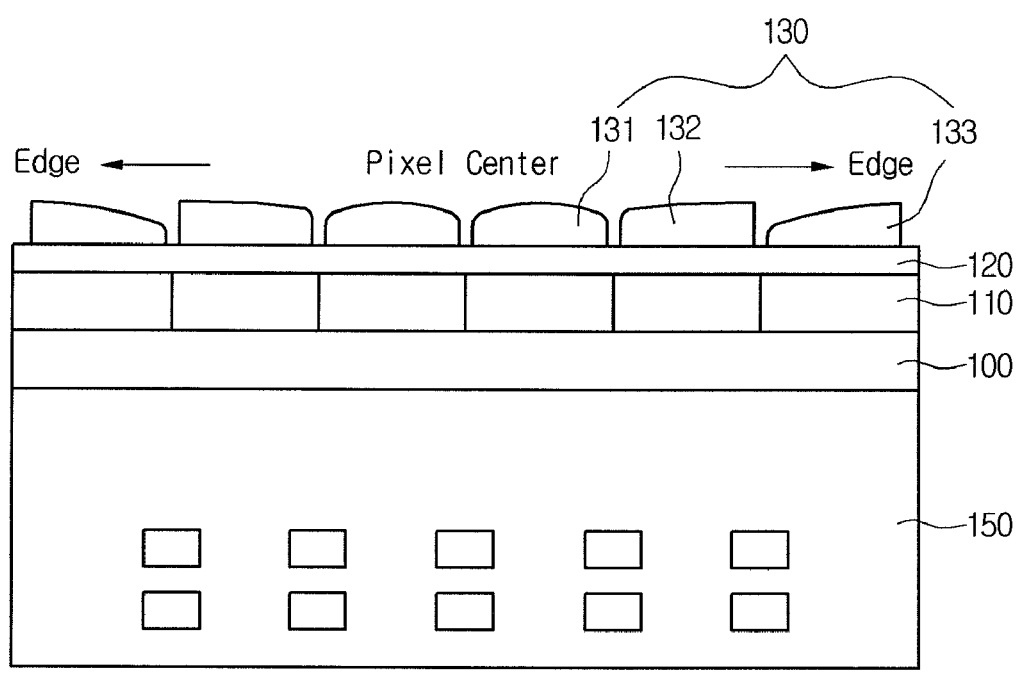

Example FIG. 2 is a cross-sectional view illustrating a microlens structure of a CMOS image sensor, in accordance with embodiments.

DESCRIPTION

As illustrated in example FIG. 2, passivation layer 100 may be formed on and/or over array layer 150, in accordance with embodiments. Color filter array 110 may include different colored filters (e.g. Red, Green, and/or Blue color filter) in a form of layers formed on and/or over passivation layer 100. Array layer 150 may includes a device layer having a gate poly made of poly-silicon, source/drain regions, and/or a gate oxide film.

Passivation layer 100 may serve as a protective layer covering a chip surface in array layer 150, in accordance with embodiments. Overcoat layer 120 may be formed on and/or over color filter array 110. Microlens layer 130 may be formed at a pixel region on and/or over overcoat layer 120. The pixel region formed Microlens layer 130 may includes microlenses 131, 132, and 133 that have different shapes, in accordance with embodiments.

In embodiments, the shapes of microlenses 131, 132, and 133 may be different based on their relative position between the edge and the center of the pixel region. For example, microlens 133 at the edge of the pixel region has a different shape than microlens 131 at the center of pixel region, in accordance with embodiments. In embodiments, microlens 132 may have a shape that is in between the shape of microlens 131 and microlens 133, since it is positioned between the center and the edge of the pixel region. Although FIG. 2 only illustrates three different shapes of microlenses, one of ordinary skill would appreciate that more or less different shapes may be included in embodiments. In embodiments, microlens 131 in the center of the pixel region may have the same or similar shape as microlens 20 in example FIG. 1. In embodiments, microlens 131 in the center of the pixel region may have a different shape than microlens 20 in example FIG. 1.

In embodiments, microlenses 131, 132 and 133 of the pixel region may be manufactured such that their shapes are symmetric with respect to the center of the pixel region. In embodiments, microlens 131 in the center of microlens layer 130 may have a convex lens shape, while microlens 132 and microlens 133 toward an edge of the pixel region may have surfaces inclined towards the center of the pixel region. In embodiments, the pixel region may have the shape of a parabolic antenna, such that microlens in the center have a convex shape and microlens toward an edge of the pixel region have inclined surfaces. In embodiment, microlenses toward an edge of the pixel region may be thicker than microlenses in the center. Since microlenses 131, 132 and 133 may have gradually different shapes from the edge to the center of the pixel region, the amount of incident light passing through the pixel region may be increased, in accordance with embodiments. Accordingly, optical integrity of incident light may be better from microlenses 131, 132, and 133 of example FIG. 2 compared to microlens 20 of example FIG. 1, in accordance with embodiments. In embodiments, maximized optical integrity may maximize performance of an image sensor having the pixel region.

Embodiments relate to a manufacturing method of a pixel region (e.g. a pixel region in a CMOS image sensor). Microlenses 131, 132 and 133 having different shapes which gradually change from an edge to a center of the pixel region may be formed by irradiating ultraviolet (UV) rays during a reflowing process of the microlenses 131, 132 and 133, according to embodiments. During an UV irradiation process, an intensity profile of UV light may be complementary to the different shapes of microlenses 131, 132 and 133, in accordance with embodiments. In other words, microlenses 131, 132, and 133 may be manufactured to have desired shapes by controlling an intensity profile of UV light during a reflowing process.

Microlenses 131, 132 and 133 with the different shapes illustrated in example FIG. 2 are merely examples of shapes. One of ordinary skill in the art would appreciate other shapes and configures, without departing from the scope and spirit of embodiments. In other words, various shapes of microlenses, which are different from those of the lenses of FIG. 2, may be adopted in a CMOS image sensor, and may be within the spirit and scope of embodiments.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a pixel region; and
   a plurality of microlenses over the pixel region, wherein at least two of the plurality of microlenses have different shapes based on a relative position of the plurality of microlenses between a center and an edge of the pixel region;

wherein microlenses in the center of the pixel region have a convex shape and microlenses toward the edge of the pixel region have an inclined shape toward the center of the pixel region; and wherein an incline of microlenses closer to the edge of the pixel region is steeper than microlenses closer to the center of the pixel region.

2. The apparatus of claim 1, wherein the apparatus is an image sensor.

3. The apparatus of claim 2, wherein the image sensor is a CMOS image sensor.

4. The apparatus of claim 1, wherein the different shapes are symmetrical with respect to the center of the pixel region.

5. The apparatus of claim 1, wherein each of the microlenses has both edge portions, and a first edge portion closer to the edge of the pixel region is thicker than a second edge portion closer to the center of the pixel region.

6. The apparatus of claim 1, wherein the different shapes are formed based on a profile of ultraviolet incident on the plurality of microlenses during reflowing of the microlenses during manufacturing.

* * * * *